(12) United States Patent
Li et al.

(10) Patent No.: US 11,818,920 B2
(45) Date of Patent: Nov. 14, 2023

(54) DISPLAY PANEL AND MANUFACTURING METHOD THEREOF, DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Zeliang Li, Beijing (CN); Yanqiang Wang, Beijing (CN); Tao Gao, Beijing (CN); Guoyi Cui, Beijing (CN); Zhendong Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 29 days.

(21) Appl. No.: 17/332,020

(22) Filed: May 27, 2021

(65) Prior Publication Data
US 2022/0093701 A1 Mar. 24, 2022

(30) Foreign Application Priority Data
Sep. 23, 2020 (CN) .......................... 202011011545.4

(51) Int. Cl.
*H01L 27/32* (2006.01)
*H01L 51/56* (2006.01)
(Continued)

(52) U.S. Cl.
CPC ......... *H10K 59/123* (2023.02); *H10K 59/121* (2023.02); *H10K 59/124* (2023.02);
(Continued)

(58) Field of Classification Search
CPC ............ H10K 59/121; H10K 59/1213; H10K 59/123; H10K 59/124; H10K 59/179; H10K 59/34; H10K 59/60; H10K 59/65
See application file for complete search history.

(56) References Cited

U.S. PATENT DOCUMENTS

2021/0327958 A1\* 10/2021 Li ........................... H01L 33/42
2021/0327967 A1\* 10/2021 Zhang .................... H10K 59/65
(Continued)

FOREIGN PATENT DOCUMENTS

CN 110246883 A \* 9/2019 ........... H10K 59/352

OTHER PUBLICATIONS

Machine translation, Yang, Chinese Pat. Pub. No. CN110246883A, translation date: Jun. 23, 2023, Clarivate Analytics, all pages. (Year: 2023).\*

*Primary Examiner* — Victoria K. Hall
(74) *Attorney, Agent, or Firm* — XSENSUS LLP

(57) ABSTRACT

A display panel includes an under screen camera display area and a normal display area surrounding the under screen camera display area, a plurality of switch assemblies are positioned at the normal display area, and a plurality of sub-pixels are positioned at the under screen camera display area. The display panel includes an insulating layer group and a plurality of connection lines; a plurality of trenches are positioned on the insulating layer group and extend from the sub-pixels to the switch assemblies; and at least part of the connection lines is positioned in the trench to reduce spacing distance between two adjacent connection lines, where the connection lines are connected between the switch assemblies and the sub-pixels.

19 Claims, 6 Drawing Sheets

(51) Int. Cl.
*H10K 59/123* (2023.01)
*H10K 59/65* (2023.01)
*H10K 71/00* (2023.01)
*H10K 59/121* (2023.01)
*H10K 59/124* (2023.01)
*H10K 59/35* (2023.01)

(52) U.S. Cl.
CPC ............. *H10K 59/65* (2023.02); *H10K 71/00* (2023.02); *H10K 59/353* (2023.02)

(56) References Cited

U.S. PATENT DOCUMENTS

| | | | |
|---|---|---|---|
| 2022/0005890 A1* | 1/2022 | Yan | H10K 71/00 |
| 2022/0045151 A1* | 2/2022 | Jeong | H10K 59/1216 |
| 2022/0093711 A1* | 3/2022 | Jia | H10K 59/123 |
| 2022/0165827 A1* | 5/2022 | Xu | H10K 59/1201 |
| 2022/0310746 A1* | 9/2022 | Huang | G09G 3/3233 |

* cited by examiner

DISPLAY PANEL AND MANUFACTURING METHOD THEREOF, DISPLAY DEVICE

CROSS-REFERENCE TO RELATED APPLICATIONS

This application is based upon, and claims the benefit of and priority to, Chinese Patent Application No. 202011011545.4, filed Sep. 23, 2020, the entire contents of which are incorporated herein by reference.

TECHNICAL FIELD

The present disclosure relates to the field of display technology and, particularly, to a display panel and a manufacturing method of the display panel, and a display device including the display panel.

BACKGROUND

With the development of display technology, providing a camera under a display screen has become a new type of display technology, which can realize the full screen display so as to increase screen-to-body ratio of a device.

Currently, however, light transmittance of the camera area of a display screen is relatively low, the pixel density is relatively low, and the size of a camera which can be provided is relatively small.

Therefore, it is necessary to study a new display panel and a manufacturing method of the display panel and a display device including the display panel.

The foregoing information disclosed by the background section is only used to enhance the understanding of the background of the present disclosure, and therefore it may include information that does not constitute the prior art known to those of ordinary skilled in the art.

SUMMARY

The object of the present disclosure is to provide a display panel of which the pixel density is relatively high, a manufacturing method of the display panel and a display device including the display panel.

The additional aspects and advantages of the present disclosure will be partially set forth in the following description, and will partially become apparent from the description, or may be learned through practice of the present disclosure.

According to an aspect of the present disclosure, there is provided a display panel, having an under screen camera display area and a normal display area surrounding the under screen camera display area, a plurality of switch assemblies being positioned at the normal display area, and a plurality of sub-pixels being positioned at the under screen camera display area, where the display panel includes:

an insulating layer group, with a plurality of trenches being positioned thereon, and the trenches extend from the sub-pixels to the switch assemblies; and a plurality of connection lines, where at least part of the connection line is positioned in the trench to reduce a spacing distance between two adjacent connection lines, and the connection line are connected between the switch assemblies and the sub-pixels.

According to another aspect of the present disclosure, there is provided a manufacturing method of a display panel, the display panel having an under screen camera display area and a normal display area surrounding the under screen camera display area, where the manufacturing method includes:

forming a plurality of switch assemblies at the normal display area;

forming an insulating layer group at one side of the plurality of the switch assemblies, and forming a plurality of trenches on the insulating layer group, where the trenches extend from the under screen camera display area to the normal display area;

forming a plurality of connection lines, where at least part of the connection lines is formed in the trench to reduce a spacing distance between two adjacent connection lines; and forming a plurality of sub-pixels at one side of the insulating layer group away from the switch assemblies, where the sub-pixels are connected to the switch assemblies through the connection lines.

According to yet another aspect of the present disclosure, there is provided a display device, including: a display panel according to any one of the foregoing embodiments.

BRIEF DESCRIPTION OF THE DRAWINGS

The foregoing and other features and advantages of the present disclosure will become more apparent through describing the exemplary embodiments thereof in detail with reference to the accompanying drawings.

DETAILED DESCRIPTION

The exemplary embodiments will now be more fully described with reference to the accompanying drawings. However, the exemplary embodiments can be implemented in various manners, and should not be understood as being limited to the embodiments set forth here. On the contrary, these embodiments are provided so that the present disclosure will be comprehensive and complete, and the conception of the exemplary embodiments will be fully conveyed to those skilled in the art. Same reference numbers in the figures represent same or similar structures, and thus their detailed description will be omitted.

Figure 1:
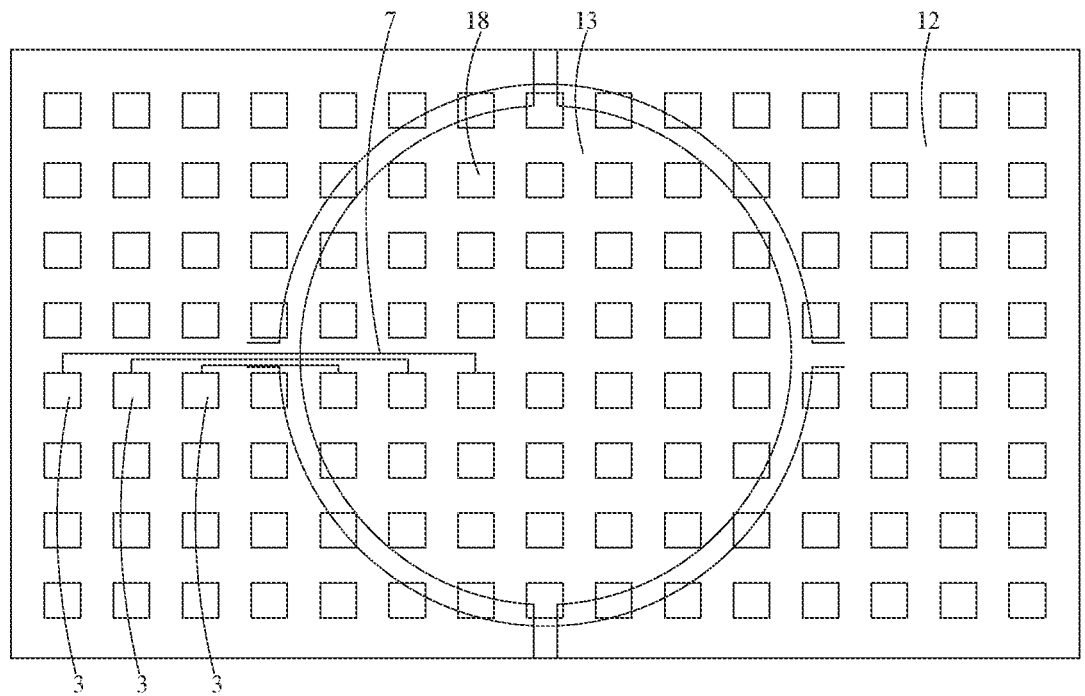
FIG. 1 is a schematic top view of a display panel in the related art.
Figure 2:
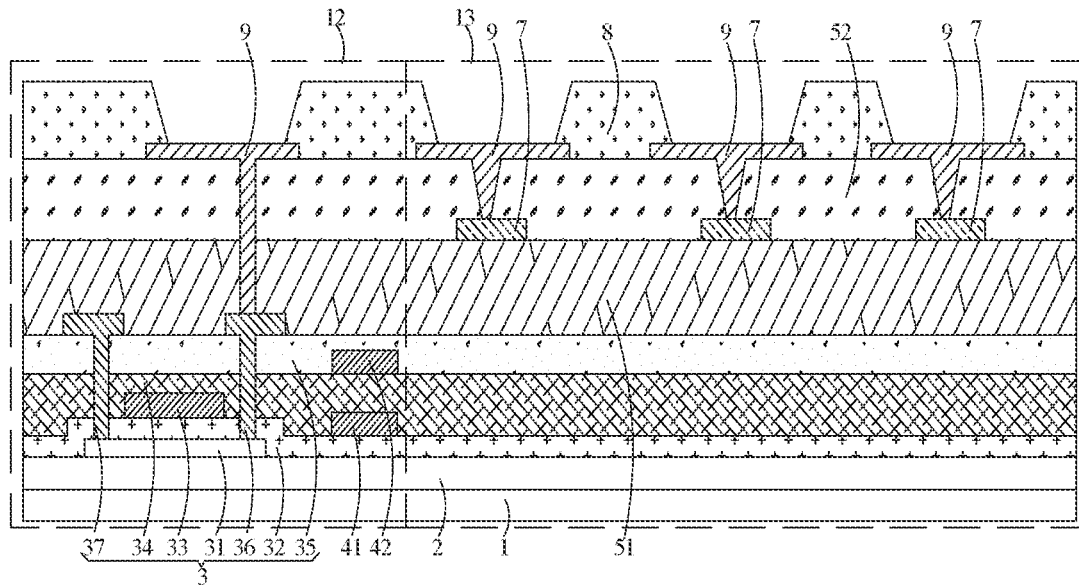
FIG. 2 is a schematic structural diagram of a display panel according to an exemplary embodiment of the related art.

Referring to the schematic structural diagram of a display panel according to an exemplary embodiment of the related art shown in FIG. 1 and FIG. 2, the display panel has an under screen camera display area 13 and a normal display area 12 surrounding the under screen camera display area 13. In order to increase the light transmittance of the under screen camera display area 13 and improve the imaging effect of the camera, instead of a switch assembly 3, only a sub-pixel 18 is positioned at the under screen camera display area 13. However, the sub-pixel 18 positioned at the under screen camera display area 13 also needs to be controlled through the switch assembly 3. Therefore, the sub-pixel 18 and the switch assembly 3 need to be connected through a connection line 7. However, if the pixel density at the under screen camera display area 13 is relatively large, which causes space between the sub-pixels 18 to be relatively small, there may not be many connection lines 7 that can be accommodated for passing through. Therefore, there are not so many sub-pixels 18 that can be provided to increase the pixel density. In addition, when a plurality of the connection lines 7, which connect the sub-pixels 18 positioned at the under screen camera display area 13 to the switch assemblies 3, are positioned on a same planarization layer, wet etching is adopted as the manufacturing process of the connection lines 7. Limited by the process condition of wet etching, a gap between two adjacent connection lines 7 cannot be too small. Therefore, there may be not so many connection lines 7 that can be provided in a certain area, thereby preventing enough pixels from being provided to increase the pixel density of the under screen camera display area 13.

Figure 3:
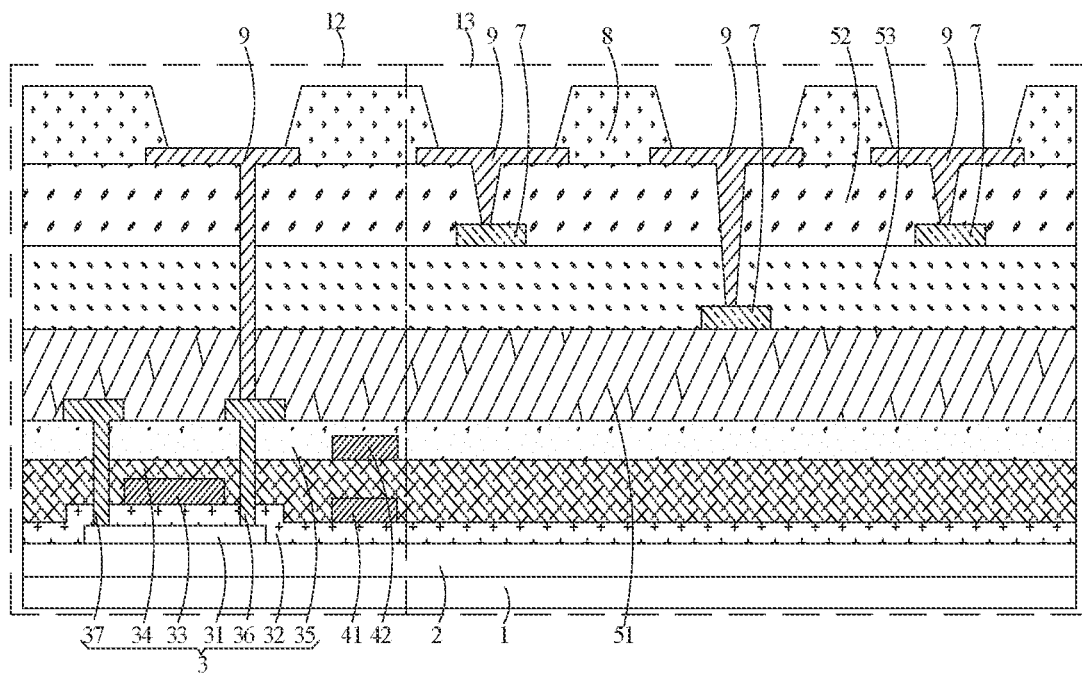
FIG. 3 is a schematic structural diagram of a display panel according to another exemplary embodiment of the related art.

Referring to the schematic structural diagram of a display panel according to another exemplary embodiment of the related art shown in FIG. 3, in the exemplary embodiment, two adjacent connection lines 7 are positioned at different layers so as to increase a gap between the two adjacent connection lines 7 of the same layer. However, one layer of third planarization layer 53 needs to be added, and two etching processes also need to be added. Therefore, the cost is greatly increased.

The present exemplary embodiments first provide a display panel. Referring to the schematic structural diagrams of display panels of the present disclosure shown in FIG. 4 to FIG. 8, a display panel is provided with an under screen camera display area 13 and a normal display area 12 surrounding the under screen camera display area 13. A plurality of switch assemblies 3 are positioned at the normal display area 12, and a plurality of sub-pixels 18 are positioned at the under screen camera display area 13. The display panel includes an insulating layer group and a plurality of connection lines 7. A plurality of trenches 6 are positioned on the insulating layer group, where the trenches 6 extend from the sub-pixel 18 to the switch assembly 3. At least part of the plurality of the connection lines 7 is positioned in the trench 6 to reduce a spacing distance between two adjacent connection lines 7, where the connection line 7 connects between the switch assembly 3 and the sub-pixel 18.

Figure 4:
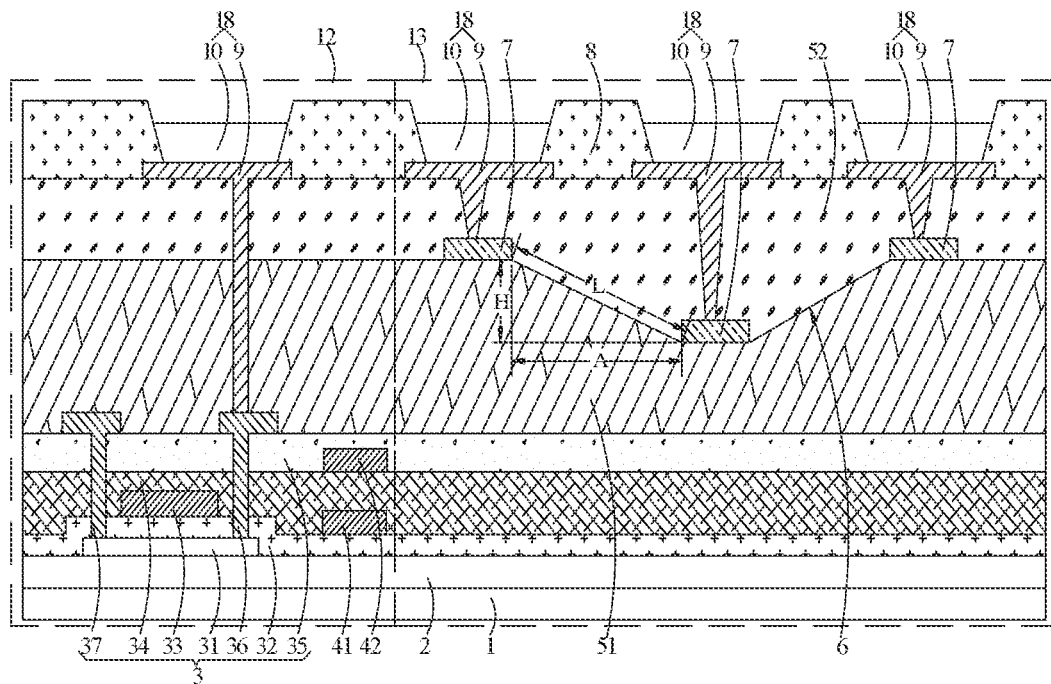
FIG. 4 is a schematic structural diagram of a display panel according to a first exemplary embodiment of the present disclosure.

Referring to FIG. 4, the display panel may include a base substrate 1, and the base substrate 1 may be a polyimide resin. Alternatively, in another exemplary embodiment of the present disclosure, the base substrate 1 may be a glass substrate. A buffer layer 2 is positioned on the base substrate 1.

A plurality of switch assemblies 3 are positioned at the normal display area 12 and the switch assembly 3 may be a top gate type TFT (Thin Film Transistor). The specific structure of the switch assembly 3 may be as follows. An active layer 31 is positioned at one side of the buffer layer 2 away from the base substrate 1, a first gate insulating layer 32 is positioned at one side of the active layer 31 away from the base substrate 1, and a first via is positioned on the first gate insulating layer 32, where the first via exposes the active layer 31. A gate 33 and a first electrode 41 of a capacitor are positioned at one side of the first gate insulating layer 32 away from the base substrate 1. A second gate insulating layer 34 is positioned at one side of the gate 33 away from the base substrate 1, and a second via communicated with the first via is positioned on the second gate insulating layer 34. A second electrode 42 of the capacitor is positioned at one side of the second gate insulating layer 34 away from the base substrate 1, where the second electrode 42 of capacitor and the first electrode 41 of the capacitor are positioned directly opposite. An interlayer dielectric 35 is positioned at one side of the second electrode 42 of the capacitor away from the base substrate 1, and a third via communicated with the first via is positioned on the interlayer dielectric 35. A source 36 and a drain 37 are positioned at one side of the interlayer dielectric 35 away from the base substrate 1, where the source 36 and the drain 37 are connected to the active layer 31 through the third via, the second via, and the first via. Alternatively, in another exemplary embodiment of the present disclosure, the switch assembly 3 may also be a bottom gate type TFT, a double gates type TFT, or the like, which will not be elaborated here.

A first planarization layer 51 is positioned at one side of the source 36 and the drain 37 away from the base substrate 1, and a fourth via is positioned on the first planarization layer 51. A second planarization layer 52 is positioned at one side of the first planarization layer 51 away from the base substrate 1.

The first gate insulating layer 32, the second gate insulating layer 34, the interlayer dielectric 35, the first planarization layer 51, and the second planarization layer 52 all extend to the under screen camera display area 13.

A plurality of trenches 6 are positioned on the first planarization layer 51, where the trench 6 extends from the under screen camera display area 13 to the normal display area 12. One of the two adjacent connection lines 7 is positioned in the trench 6, and the other one is positioned at one side of the first planarization layer 51 away from the base substrate 1. The connection line 7 also extends from the under screen camera display area 13 to the normal display area 12. Material of the connection line 7 is indium tin oxide (ITO) or tin-doped indium oxide. Alternatively, the material of the connection line 7 may also be other transparent conductive material.

As can be seen from FIG. 4, a distance between the two adjacent connection lines 7 is L, a spacing distance between the two adjacent connection lines 7 is A, a difference in height between the two adjacent connection lines 7 is H, where the difference in height is depth of the trench 6, and $L=(A^2+H^2)^{1/2}$, $L>A$. Since there is the difference in height H between the two adjacent connection lines 7, in the case that a same pixel density is ensured, the distance L between the two adjacent connection lines 7 can be increased, thereby being beneficial to improving the process capability. Similarly, when the distance L under the process capability is reached, the spacing distance A between the two adjacent connection lines 7 can be decreased, so that the spacing distance between pixels can be reduced, thereby increasing the pixel density or increasing size of the camera. Moreover, L is proportional to H, and the greater the depth of the trench 6, the greater the distance L between the two adjacent connection lines 7 can be made. In the case that L is kept unchanged, the larger H is, the smaller A can be. Therefore, as long as allowed by the process design, the larger the depth of the trench 6 is designed, the more beneficial to increasing the pixel density it is.

The second planarization layer 52 covers one side of the connection line 7 away from the base substrate 1, and a fifth via is positioned on the second planarization layer 52. A first electrode 9 is positioned at one side of the second planarization layer 52 away from the base substrate 1. At the normal display area 12, the first electrode 9 is connected to the source 36 or the drain 37 through the fifth via and the fourth via. At the under screen camera display area 13, the first electrode 9 is connected to the connection line 7 through the fifth via, thereby connecting the sub-pixel 18 to the connection line 7. The connection line 7 is then connected to the switch assembly 3 positioned at the normal display area 12, thereby connecting the switch assembly 3 and the sub-pixel 18 through the connection line 7. Through the switch assembly 3 positioned at the normal display area 12, the sub-pixel 18 positioned at the under screen camera display area 13 can be controlled.

A pixel defining layer 8 is positioned on the first electrode 9. A sixth via is positioned on the pixel defining layer 8 to expose the first electrode 9. A light emitting layer 10 is positioned in the sixth via, where the light emitting layer 10 is connected with the first electrode 9. A second electrode (not shown in the figure) is positioned at one side of the light emitting layer 10 away from the base substrate 1.

In the exemplary embodiment, the first electrode 9 is an anode and the second electrode is a cathode.

Figure 5:
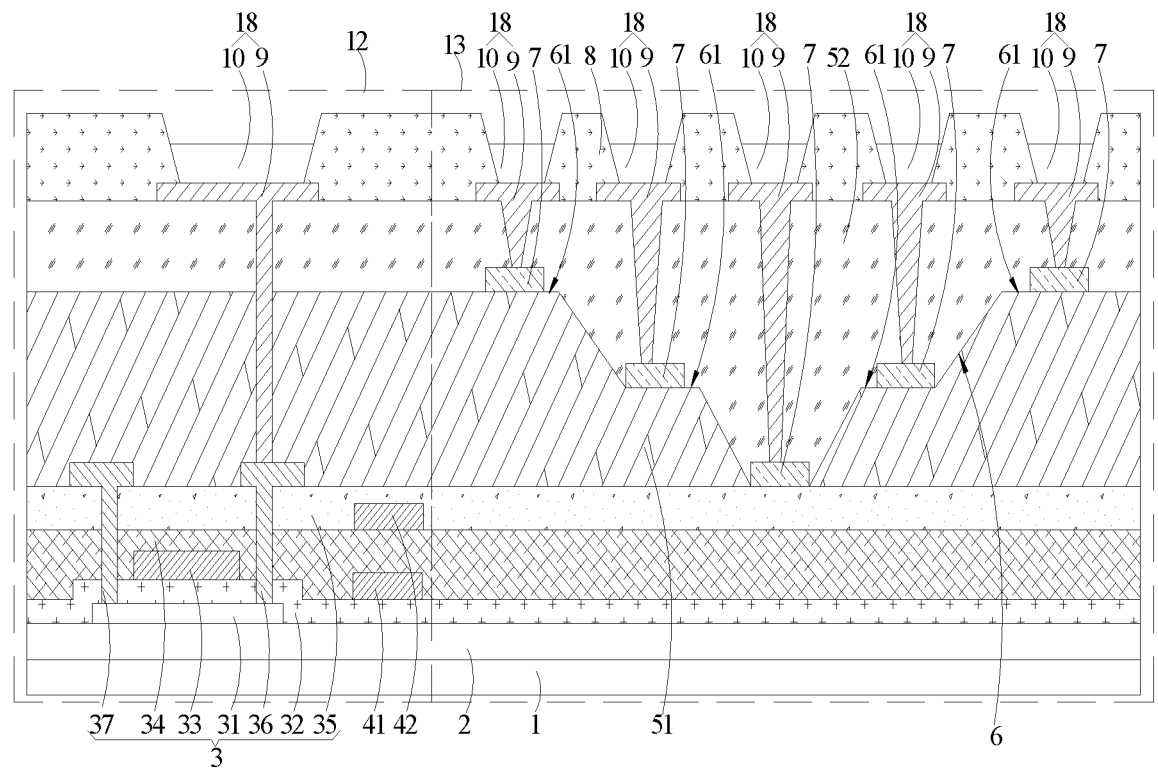
FIG. 5 is a schematic structural diagram of a display panel according to a second exemplary embodiment of the present disclosure.

Referring to the schematic structural diagram of a display panel according to a second exemplary embodiment of the present disclosure shown in FIG. 5, structure of a normal display area 12 in the exemplary embodiment is identical to the structure of the normal display area 12 in the first exemplary embodiment, which is not repeatedly described here. The main difference between the exemplary embodiment and the first exemplary embodiment lies in that a trench wall of the trench 6 is provided in in a stepped shape.

In the exemplary embodiment, a trench 6 is positioned on a first planarization layer 51. The trench 6 penetrates downwards through the first planarization layer 51 to an interlayer dielectric 35. Two trench walls of the trench 6 are both provided with one step, and extending direction of the step is consistent with extending direction of the trench 6, so that one side of the trench 6 forms three step surfaces 61, i.e., there are totally three step surfaces, namely, the step surfaces 61 on a trench bottom and a trench wall and one side of the first planarization layer 51 away from the base substrate 1, where the trench bottom is shared by two sides, so the trench walls of two sides of the trench 6 include five step surfaces 61. Among the five connection lines 7, the connection line 7 located most central is positioned at the trench bottom of the trench 6, i.e., the connection line 7 located most central is positioned at one side of the interlayer dielectric 35 away from the base substrate 1. The connection lines 7 located at the two sides are positioned at one side of the first planarization layer 51 away from the base substrate 1. The rest two connection lines 7 are respectively positioned on the step surfaces 61 of the steps. The step surface on the trench wall may be formed through masking with a translucent mask and then etching.

Alternatively, in another exemplary embodiment of the present disclosure, in the case that a trench 6 does not penetrate through a first planarization layer 51, a side wall of the trench 6 may also be provided in a stepped shape, and a connection line 7 may be positioned on a step surface 61. The number of steps may also be set according to actual needs and an allowed thickness of the first planarization layer 51. In addition, the trench 6 is not necessarily positioned on the first planarization layer 51, but also can be provided on a passivation layer 16 or the interlayer dielectric 35.

Through the exemplary embodiments, the pixel density of the under screen camera display area 13 can be increased, or a camera with a relatively large size can be selected, and the principle thereof is identical to the principle described in the first exemplary embodiment, which is not repeatedly described here.

Figure 6:
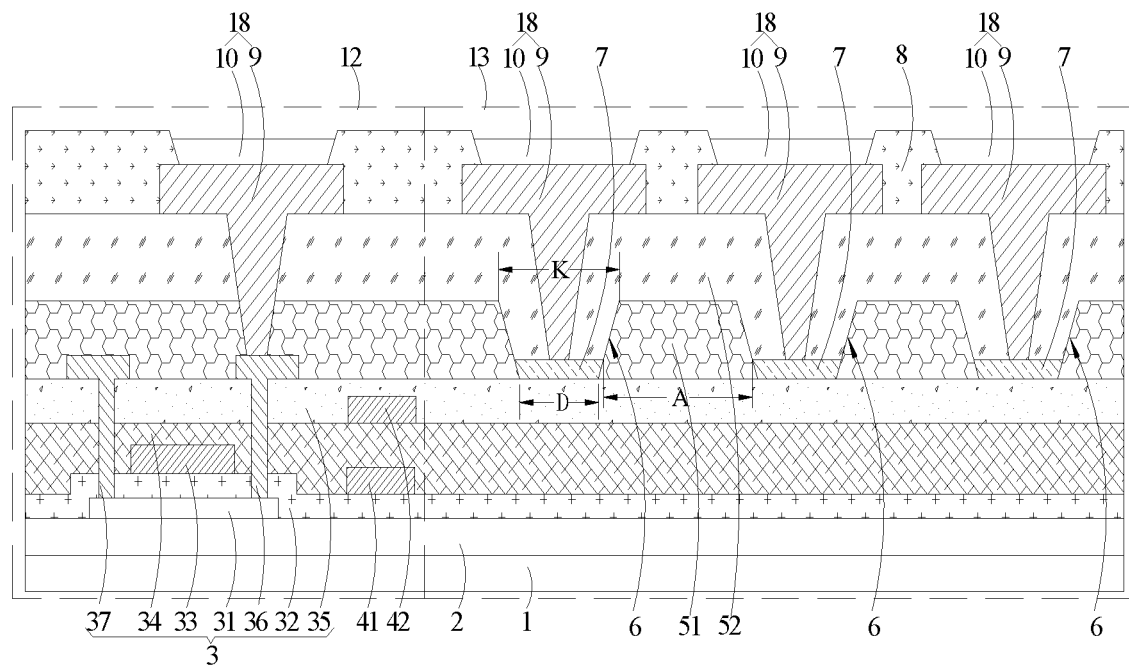
FIG. 6 is a schematic structural diagram of a display panel according to a third exemplary embodiment of the present disclosure.

Referring to the schematic structural diagram of a display panel according to a third exemplary embodiment of the present disclosure shown in FIG. 6, the structure of a normal display area 12 in the exemplary embodiment is identical to the structure of the normal display area 12 in the first exemplary embodiment, which is not repeatedly described here. The main difference between the exemplary embodiment and the first exemplary embodiment lies in that connection lines 7 are all provided in a trench 6.

In the exemplary embodiment, a plurality of trenches 6 are positioned on a first planarization layer 51 and all penetrate downwards through the first planarization layer 51 to an interlayer dielectric 35. A material of the first planarization layer 51 may be resin, and the trench 6 formed by etching is an inverted trapezoid with an opening width K greater than a trench bottom width D. A length direction of the trench is consistent with extending direction of the trench and a width direction thereof is substantially perpendicular to the length direction. Connection lines 7 are all positioned in the trench 6, and located at one side of the interlayer dielectric 35 away from a base substrate 1. The first planarization layer 51 between the two adjacent trenches 6 forms an isolation part of the connection line 7.

Figure 7:
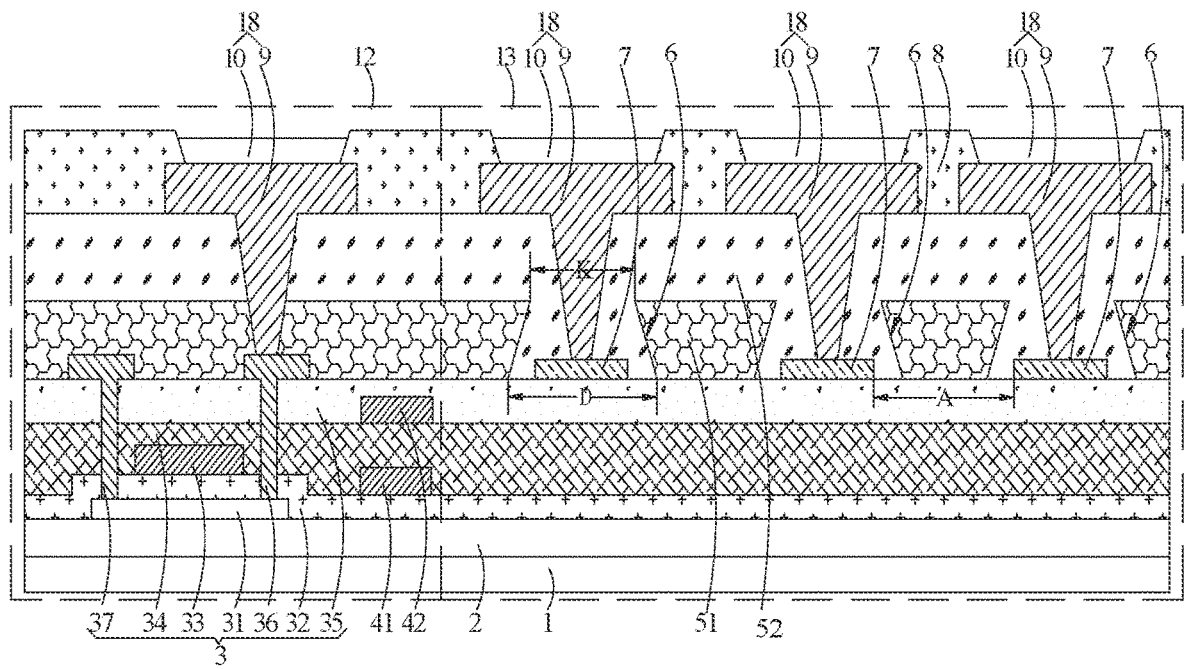
FIG. 7 is a schematic structural diagram of a display panel according to a fourth exemplary embodiment of the present disclosure.

Referring to the schematic structural diagram of a display panel according to a fourth exemplary embodiment of the present disclosure shown in FIG. 7, a structure of a normal display area 12 in the exemplary embodiment is identical to the structure of the normal display area 12 in the first exemplary embodiment, which is not repeatedly described here. The main difference between the exemplary embodiment and the third exemplary embodiment lies in that material of a first planarization layer 51 is negative photoresist, and a trench 6 formed by etching is a trapezoid with an opening width K smaller than a trench bottom width D. A length direction of the trench is consistent with extending direction of the trench and a width direction thereof is substantially perpendicular to the length direction.

Figure 8:
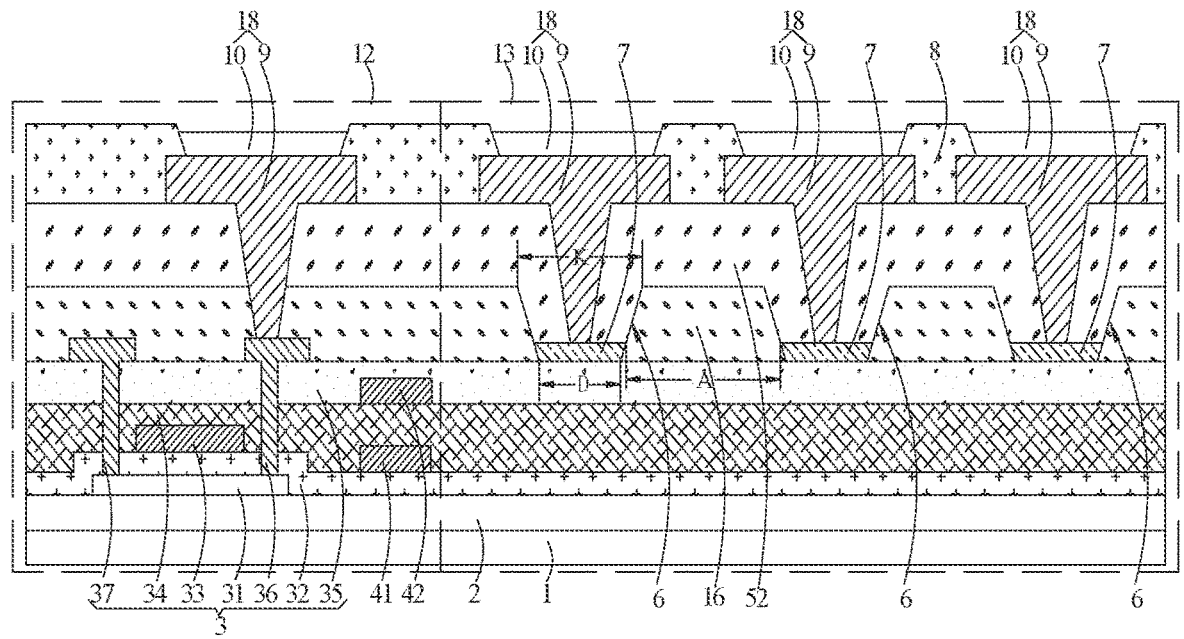
FIG. 8 is a schematic structural diagram of a display panel according to a fifth exemplary embodiment of the present disclosure.

Referring to the schematic structural diagram of a display panel according to a fifth exemplary embodiment of the present disclosure shown in FIG. 8, a structure of a normal display area 12 in the exemplary embodiment is identical to the structure of the normal display area 12 in the first exemplary embodiment, which is not repeatedly described here. The main differences between the exemplary embodiment and the third exemplary embodiment lie in that, there is a passivation layer 16 positioned at one side of a source 36 and a drain 37 away from a base substrate 1, and a fourth via is positioned on the passivation layer 16. A second planarization layer 52 is positioned at one side of the passivation layer 16 away from the base substrate 1. In other words, the passivation layer 16 is used to replace the first planarization layer 51 in the third exemplary embodiment. Material of the passivation layer 16 may be silicon oxide, silicon nitride, or silicon oxynitride, or may also be a layered structure formed by two or three of silicon oxide, silicon nitride, and silicon oxynitride. A plurality of trenches 6 are positioned on the passivation layer 16, and a connection lines 7 are all positioned in the trench 6.

Figure 9:
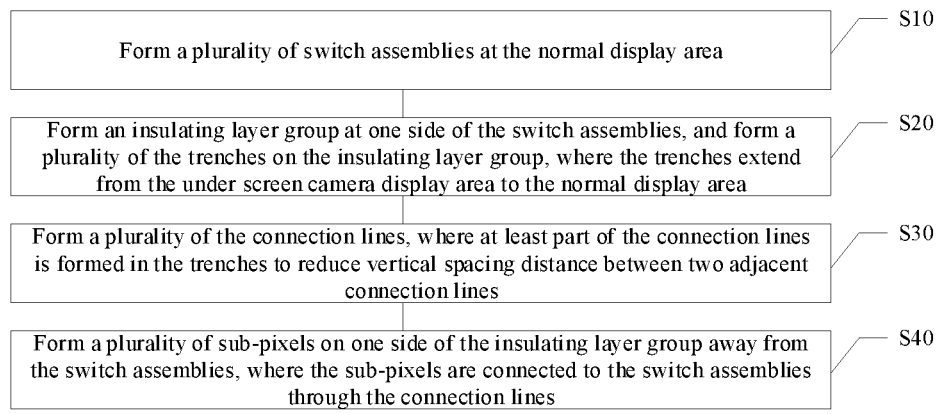
FIG. 9 is a schematic flow chart illustrating a manufacturing method of a display panel according to an exemplary embodiment of the present disclosure.

Further, the present disclosure also provides a manufacturing method of a display panel, where the display panel is provided with an under screen camera display area 13 and a normal display area 12 surrounding the under screen camera display area 13. Referring to the flow chart illustrating a manufacturing method of a display panel according to the present disclosure shown in FIG. 9. The manufacturing method of the display panel may include following steps.

In step S10, a plurality of switch assemblies 3 is formed at the normal display area 12.

In step S20, an insulating layer group is formed at one side of the plurality of switch assemblies 3, and a plurality of trenches 6 are formed on the insulating layer group, where the trench 6 extends from the under screen camera display area 13 to the normal display area 12.

In step S30, a plurality of the connection lines 7 are formed, where at least part of the connection lines is formed in the trench 6 to reduce a spacing distance between two adjacent connection lines 7.

In step S40, a plurality of sub-pixels 18 are formed on one side of the insulating layer group away from the switch assembly 3, where the sub-pixel 18 is connected to the switch assembly 3 through the connection line 7.

Figure 10:
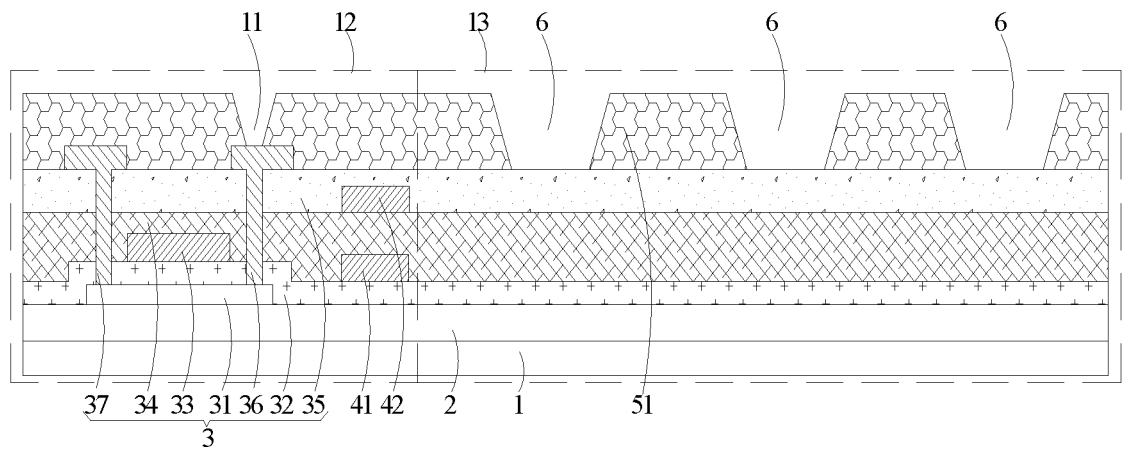
FIG. 10 to FIG. 13 are schematic diagrams illustrating steps of manufacturing a display panel according to the third exemplary embodiment of the present disclosure.

In the exemplary embodiment, referring to FIG. 10, after the plurality of switch assemblies 3 are formed at the normal display area 12, a first planarization layer 51 is formed at one side of a source 36 and drain 37 away from a base substrate 1, and a trench 6 and a fourth via 11 are formed on the first planarization layer 51, where the trench 6 extends from an under screen camera display area 13 to a normal display area 12, and the fourth via 11 exposes the source 36.

Figure 11:
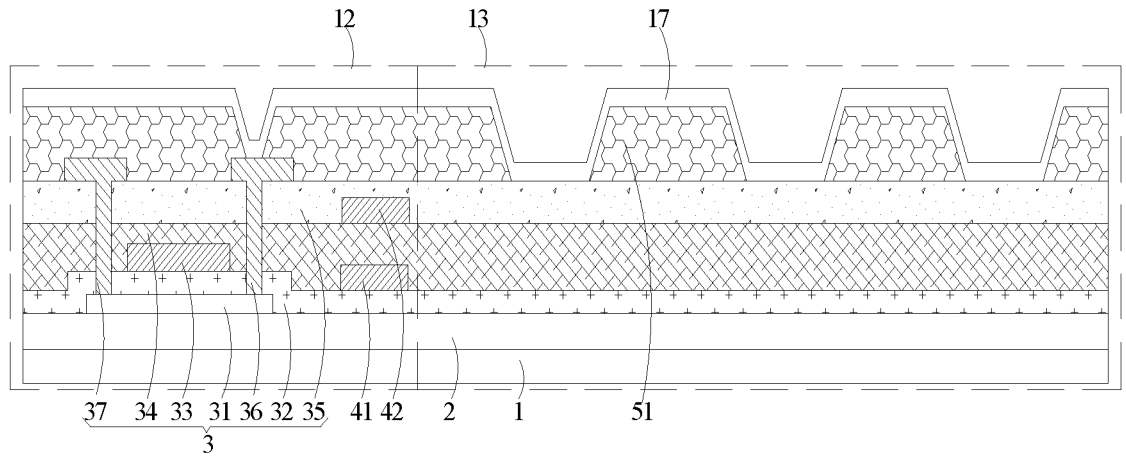

Referring to FIG. 11, a line material layer 17 is formed at one side of a first planarization layer 51 away from a base substrate 1, where the first planarization layer 51 is covered by the line material layer 17 thereon, a trench 6 is covered by the line material layer 17 therein and a fourth via 11 is covered by the line material layer 17 therein.

Figure 12:
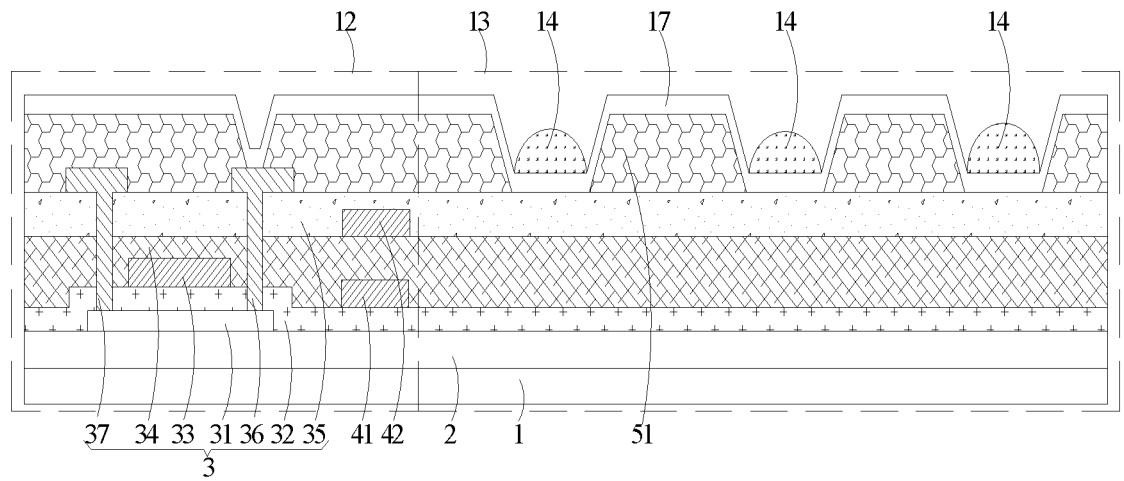

Referring to FIG. 12, photoresist 14 is formed at one side of a line material layer 17 away from a base substrate 1, and exposure process is performed to remove the photoresist 14 on a first planarization layer 51 and in a fourth via 11, with the photoresist 14 in a trench 6 being retained.

Figure 13:
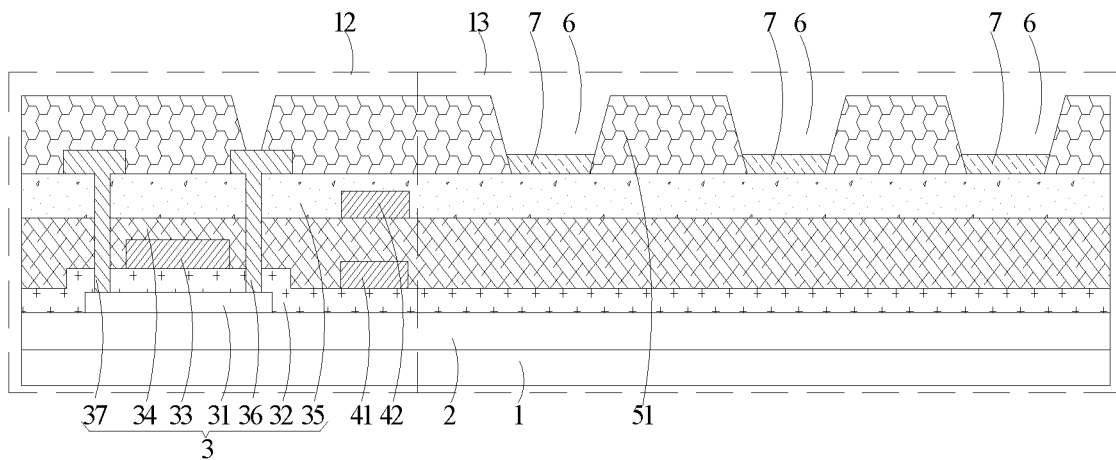

Referring to FIG. 13, a line material layer 17 is etched using photoresist 14 as a mask, and the line material layer 17 in a trench 6 is retained so as to form a connection line 7.

In the etching process of forming a connection line 7 in the related art in FIG. 1, since the line material layer 17 is formed on the upper plane of a first planarization layer 51, after photoresist 14 is formed on the line material layer 17 and exposed, one trench will be formed between the photoresist 14. Etching applied to the line material layer 17 at the bottom of the trench not covered by the photoresist 14 may result in incomplete replacement, so a spacing distance between the connection lines 7 needs to be enlarged so that complete etching can be ensured. While in the exemplary embodiment, the line material layer 17 which needs to be etched is positioned on the upper plane of the first planarization layer 51, which is prominent relative to the photoresist 14. Therefore, the result of incomplete replacement will not be produced, and the spacing distance A between the connection lines 7 does not need to be enlarged. The spacing distance A between the connection lines 7 depends on the exposure process. As long as being allowed by the exposure process, the smaller the spacing distance A between connection lines 7, the better. The smaller the spacing distance A, the more quantities of the connection lines 7 can be positioned within a certain range of size, so that more sub-pixels can be provided to increase the pixel density, or a larger camera can be provided. The line material layer 17 of the trench wall of the trench 6 may be fully retained. Since there is the first planarization layer 51 being used as an isolation part, other problem such as short circuit and the like will not arise, thereby increasing width of the connection line 7 and reducing resistance of the connection line 7, which is beneficial to reducing the power consumption.

Further, the present disclosure also provides a display device, where the display device may include any of the foregoing display panels. The specific structure of the display panel has been described in detail hereinabove, therefore, which is not repeatedly described here.

Specific type of the display device is not particularly limited. Any type of display device commonly used in the art will do, for example, other mobile device such as a mobile phone and the like, other wearable device such as a watch and the like and a VR device, etc. Those skilled in the art may select accordingly according to the specific purpose of the display device, which is not repeatedly described here.

It should be noted that, in addition to a display panel, the display device also includes other necessary component and composition, taking a display as an example, specifically for example, a housing, a circuit board and a power cord, etc. Those skilled in the art may make a corresponding supplement according to the specific usage requirement of the display device, which is not repeated described here.

Compared with the prior art, the beneficial effect of a display device provided by an exemplary embodiment of the present disclosure is identical to the beneficial effect of a display panel provided by the foregoing exemplary embodiments, which is not repeatedly described here.

It may be understood based on the foregoing technical solutions that the present disclosure has at least one of the following advantages and positive effects.

According to the display panel of the present disclosure, a plurality of trenches are provided on an insulating layer group, where the trenches extend from a sub-pixel to a switch assembly; at least part of the connection lines is positioned in the trench to reduce a spacing distance between two adjacent connection lines, so that relatively large number of connection lines can be provided within a certain size of area, and thus relatively large number of sub-pixels can be provided at an under screen camera display area. The sub-pixels may be connected to the switch assemblies positioned at a normal display area through the connection lines, and the control of the sub-pixels can be achieved through the switch assemblies, thereby increasing the pixel density of the under screen camera display area. Also, a camera of a relatively large size can be provided.

The features, structures or characteristics of the forgoing description may be combined into one or more embodiments in any suitable manner. If possible, the features discussed in the various embodiments are interchangeable. In the above description, many specific details are provided thereby giving a sufficient understanding of the embodiments of the present disclosure. However, those skilled in the art will realize that the technical solution of the present disclosure may be practiced without one or more of the specific details.

Alternatively, other methods, assemblies, and material, etc., may be used. In other cases, well-known structure, material, or operations are not shown or described in detail to avoid obscuring aspects of the present disclosure.

Although relative terms are used in the present specification, for example "above" and "below", to describe a relative relationship of one assembly as shown in figures to another assembly, these terms are used for convenience only in the present specification, for example, according to direction of an example described in the figures. It can be understood that if a device as shown in figures is turned over, an assembly "above" described will become an assembly "below". Other relative terms, for example, "high", "low", "top" and "bottom", etc., all have similar meanings. When a certain structure is "on" other structure, it may be referred that the certain structure is integrally formed onto other structure, or that the certain structure is "directly" positioned on other structure, or that the certain structure is "indirectly" positioned on other structure through another structure.

In the present specification, the terms "a", "an", "the" and "said" being used to indicate that there are one or more elements/constituent parts/etc.; the terms "include", "comprise" and "have" being used to indicate the meaning of open-ended inclusion and referring that in addition to the listed element/constituent part/etc., there may also be additional element/constituent part/etc.; and the terms "first", "second" and "third" only being used as markers and not being a limit on the number of objects.

It is to be understood that the present disclosure does not limit an application thereof to the detailed structure and arrangement manner of a component proposed by the present specification. The present disclosure can have other embodiment, and can be implemented and executed in various manners. The foregoing variation and modification fall within the scope of the present disclosure. It is to be understood that the present disclosure disclosed and defined by the present specification extends to all alternative combinations of two or more than two individual features mentioned or apparent herein and/or in the figures. All these different combinations constitute multiple alternative aspects of the present disclosure. The embodiments described by the present specification illustrate the best manner known for implementing the present disclosure, and will enable those skilled in the art to use the present disclosure.

What is claimed is:

1. A display panel, comprising:
an under screen camera display area and a normal display area surrounding the under screen camera display area, a plurality of switch assemblies being positioned at the normal display area, and a plurality of sub-pixels being positioned at the under screen camera display area;
an insulating layer, with a plurality of trenches being positioned thereon, and the trenches extending from the sub-pixels to the switch assemblies; and
a plurality of connection lines, wherein at least part of the connection lines is positioned in the trenches, and the connection lines are connected between the switch assemblies and the sub-pixels.

2. The display panel according to claim 1, wherein a difference in height exists between at least two adjacent connection lines.

3. The display panel according to claim 2, wherein one of any two adjacent connection lines is positioned in one trench of the plurality of trenches, and a remaining one of the any two adjacent connection lines is positioned on one surface of the insulating layer.

4. The display panel according to claim 2, wherein a trench wall of the trenches is provided with a step to form a plurality of step surfaces on the insulating layer, and an extending direction of the step is consistent with an extending direction of the trenches.

5. The display panel according to claim 4, wherein any two adjacent connection lines are positioned on different step surfaces.

6. The display panel according to claim 1, wherein an isolation part formed by the insulating layer is provided between at least two adjacent connection lines.

7. The display panel according to claim 6, wherein a material of the insulating layer is negative photoresist and the trenches are provided as a trapezoid with an opening width smaller than a trench bottom width.

8. The display panel according to claim 6, wherein the insulating layer is a planarization layer or a passivation layer, and the trenches are provided as an inverted trapezoid with an opening width greater than a trench bottom width.

9. The display panel according to claim 6, wherein each of the plurality of connection lines is positioned in a respective trench of the plurality of trenches.

10. A manufacturing method of a display panel having an under screen camera display area and a normal display area surrounding the under screen camera display area, comprising:
forming a plurality of switch assemblies at the normal display area;
forming an insulating layer at one side of the plurality of switch assemblies, and forming a plurality of trenches on the insulating layer, wherein the trenches extend from the under screen camera display area to the normal display area;
forming a plurality of connection lines, wherein at least part of the connection lines is formed in the trenches; and
forming a plurality of sub-pixels at one side of the insulating layer away from the switch assemblies, wherein the sub-pixels are connected to the switch assemblies through the connection lines.

11. A display device comprising a display panel, the display panel comprising:
an under screen camera display area and a normal display area surrounding the under screen camera display area, a plurality of switch assemblies being positioned at the normal display area, and a plurality of sub-pixels being positioned at the under screen camera display area, wherein the display panel comprises:
an insulating layer, with a plurality of trenches being positioned thereon, and the trenches extending from the sub-pixels to the switch assemblies; and
a plurality of connection lines, wherein at least part of the connection lines is positioned in the trenches, and the connection lines are connected between the switch assemblies and the sub-pixels.

12. The display device according to claim 11, wherein a difference in height exists between at least two adjacent connection lines.

13. The display device according to claim 12, wherein one of any two adjacent connection lines is positioned in one trench of the plurality of trenches, and a remaining one of the two adjacent connection lines is positioned on one surface of the insulating layer.

14. The display device according to claim 12, wherein a trench wall of the trenches is provided with a step to form a plurality of step surfaces on the insulating layer, and an extending direction of the step is consistent with an extending direction of the trenches.

15. The display device according to claim 14, wherein any two adjacent connection lines are positioned on different step surfaces.

16. The display device according to claim 11, wherein an isolation part formed by the insulating layer is provided between at least two adjacent connection lines.

17. The display device according to claim 16, wherein material of the insulating layer is negative photoresist and the trenches are provided as a trapezoid with an opening width smaller than a trench bottom width.

18. The display device according to claim 16, wherein the insulating layer is a planarization layer or a passivation layer, and the trenches are provided as an inverted trapezoid with an opening width greater than a trench bottom width.

19. The display device according to claim 16, wherein each of the plurality of connection lines is positioned in a respective trench of the plurality of trenches.

* * * * *